United States Patent
Kikuchi et al.

(10) Patent No.: US 12,489,004 B2
(45) Date of Patent: Dec. 2, 2025

(54) SURFACE TREATMENT APPARATUS AND MANUFACTURING APPARATUS FOR SEMICONDUCTOR DEVICE

(71) Applicant: Yamaha Robotics Co., Ltd., Tokyo (JP)

(72) Inventors: Hiroshi Kikuchi, Tokyo (JP); Kin Ri, Tokyo (JP); Tetsuo Takano, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 76 days.

(21) Appl. No.: 18/029,663

(22) PCT Filed: Oct. 5, 2020

(86) PCT No.: PCT/JP2020/037776
§ 371 (c)(1),
(2) Date: Mar. 31, 2023

(87) PCT Pub. No.: WO2022/074719
PCT Pub. Date: Apr. 14, 2022

(65) Prior Publication Data
US 2023/0369079 A1 Nov. 16, 2023

(51) Int. Cl.
H01L 21/67 (2006.01)
H01L 23/00 (2006.01)

(52) U.S. Cl.
CPC .......... *H01L 21/6715* (2013.01); *H01L 24/80* (2013.01); *H01L 2224/80895* (2013.01); *H01L 2224/80896* (2013.01)

(58) Field of Classification Search
CPC ................ H01L 21/6715; H01L 24/80; H01L 2224/80895; H01L 2224/80896
See application file for complete search history.

(56) References Cited

U.S. PATENT DOCUMENTS 9,142,532 B2   9/2015   Suga et al.
2015/0048523 A1   2/2015   Suga et al.
2019/0326252 A1*   10/2019   Mandalapu ............. H01L 24/98

FOREIGN PATENT DOCUMENTS

JP   2012175043   9/2012
JP   2015211130   11/2015
(Continued)

OTHER PUBLICATIONS

"Office Action of Korea Counterpart Application", issued on Apr. 16, 2024, with English translation thereof, p. 1-p. 13.
(Continued)

*Primary Examiner* — George R Koch
(74) *Attorney, Agent, or Firm* — JCIPRNET

(57) ABSTRACT

A surface treatment apparatus applies a hydrophilic treatment to a bonding surface of a target object bonded to a bonded object using hydrogen bonding, the hydrophilic treatment being applied prior to the bonding. The surface treatment apparatus includes a support base and a spray nozzle. The support base supports a surface of the target object opposite to the bonding surface, the target object being one or more target objects. The spray nozzle causes dew condensation temporarily on the bonding surface by spraying, onto the bonding surface of the target object supported by the support base, humidified air having a water vapor pressure equal to or higher than a saturated water vapor pressure corresponding to a temperature of the bonding surface.

4 Claims, 7 Drawing Sheets

(56) References Cited

FOREIGN PATENT DOCUMENTS

| JP | 2018201022 | 12/2018 | | |
|----|------------|---------|---|---|
| KR | 20150006845 | 1/2015 | | |
| WO | 2017155002 | 9/2017 | | |
| WO | WO-2017155002 A1 * | 9/2017 | ............ | H01L 21/02 |
| WO | 2018062467 | 4/2018 | | |

OTHER PUBLICATIONS

"International Search Report (Form PCT/ISA/210) of PCT/JP2020/037776", mailed on Dec. 8, 2020, with English translation thereof, pp. 1-4.
"Office Action of Taiwan Counterpart Application," issued on Jul. 27, 2022, with partial English translation thereof, p. 1-p. 7.
"Search Report of Europe Counterpart Application", issued on Oct. 2, 2024, p. 1-p. 8.
"Office Action of Korea Counterpart Application", issued on Nov. 15, 2024, with English translation thereof, p. 1-p. 13.
"Office Action of Korea Counterpart Application", issued on Jul. 7, 2025, with English translation thereof, pp. 1-15.

* cited by examiner

SURFACE TREATMENT APPARATUS AND MANUFACTURING APPARATUS FOR SEMICONDUCTOR DEVICE

CROSS-REFERENCE TO RELATED APPLICATION

This application is a 371 application of the International PCT application serial no. PCT/JP2020/037776, filed on Oct. 5, 2020. The entirety of the above-mentioned patent application is hereby incorporated by reference herein and made a part of this specification.

TECHNICAL FIELD

This specification discloses a surface treatment apparatus which applies, prior to bonding, a hydrophilic treatment to a bonding surface of a target object bonded to a bonded object using hydrogen bonding, and a manufacturing apparatus for a semiconductor device including the surface treatment apparatus.

RELATED ART

In recent years, techniques for bonding a target object to a bonded object using hydrogen group bonding have been proposed. For example, conventionally, it has been proposed to use hydrogen bonding when bonding two wafers together or when bonding a chip, which is a semiconductor integrated circuit, to a wafer.

Patent Document 1 discloses a bonding apparatus for bonding wafers together, and before bonding the two, the bonding apparatus performs an activation treatment for activating the surface of each wafer and a hydrophilic treatment for hydrophilizing the surface of each wafer. In the hydrophilic treatment, a nozzle provided above the wafer is used to supply liquid pure water to the activated wafer to cause OH groups to attach to the surface of the wafer.

RELATED ART DOCUMENT

Patent Document

Patent Document 1: JP 2012-175043 A

SUMMARY OF INVENTION

Problems to be Solved by Invention

However, in the technique of Patent Document 1, since pure water is supplied to the target object (i.e., wafer) in a liquid state, droplets are likely to remain unevenly on the surface of the target object. As a result, there is a possibility that voids (microvoids) are created at the bonding interface after the wafers are bonded together. That is, in Patent Document 1, the wafers to which a hydrophilic treatment has been applied are temporarily bonded together by hydrogen bonding, and then are finally bonded by heating treatment. During the heating treatment, if a large amount of water molecules remain at the bonding interface, the remaining water molecules are rapidly removed from the bonding interface, thus creating voids (microvoids).

Thus, in some cases, it is conceivable to attach OH groups to the surface of the target object by placing the target object in a high-humidity environment. According to this form, since droplets are not generated, a large amount of water molecules can be prevented from remaining at the bonding interface after hydrogen bonding. However, in this case, gaseous water molecules are merely brought into contact with the target object surface, and it is difficult to cause bonding between OH groups and the target object surface. Thus, to attach OH groups to the surface of the target object sufficiently and reliably, the surface needs to be activated in advance by plasma treatment or the like, which complicates the overall process.

Thus, this specification discloses a surface treatment apparatus capable of easily attaching an appropriate amount of OH groups to a surface of a target object, and a manufacturing apparatus for a semiconductor device including the surface treatment apparatus.

Means for Solving Problems

A surface treatment apparatus disclosed in this specification applies a hydrophilic treatment to a bonding surface of a target object bonded to a bonded object using hydrogen bonding, the hydrophilic treatment being applied prior to the bonding. The surface treatment apparatus includes a support base and a spray nozzle. The support base supports a surface of the target object opposite to the bonding surface, the target object being one or more target objects. The spray nozzle causes dew condensation temporarily on the bonding surface by spraying, onto the bonding surface of the target object supported by the support base, humidified air having a water vapor pressure equal to or higher than a saturated water vapor pressure corresponding to a temperature of the bonding surface.

In this case, the support base may further include a cooler which cools the temperature of the bonding surface to a temperature lower than a temperature of an ambient atmosphere and higher than a dew point temperature of a water vapor pressure of the ambient atmosphere.

Further, the one or more target objects may be placed on the support base with their periphery being surrounded by a frame member. The cooler may cool the one or more target objects, and the frame member may have a position and a size at which the frame member is not cooled.

Further, the spray nozzle may be movable with respect to the support base while spraying the humidified air.

Further, the spray nozzle may have a spray area covering all of the one or more target objects.

Further, the target object may be a chip which is a semiconductor integrated circuit or a wafer to which the chip is bonded.

A manufacturing apparatus for a semiconductor device disclosed in this specification manufactures a semiconductor device by bonding a chip, which is a semiconductor integrated circuit, to a wafer using hydrogen bonding. The manufacturing apparatus for a semiconductor device includes a bonding unit and one or more surface treatment apparatuses. The bonding unit bonds the chip to a top surface of the wafer or another chip mounted on the wafer. The one or more surface treatment apparatuses apply a hydrophilic treatment to a bonding surface of a target object, which is the chip or the wafer, prior to the bonding. The surface treatment apparatus includes a support base and a spray nozzle. The support base supports a surface of the target object opposite to the bonding surface, the target object being one or more target objects. The spray nozzle causes dew condensation temporarily on the bonding surface by spraying, onto the bonding surface of the target object supported by the support base, humidified air having a water vapor pressure equal to or higher than a saturated water vapor pressure corresponding to a temperature of the bonding surface.

Effect of Invention

According to the technique disclosed in this specification, even without plasma treatment or the like, dew condensation occurs only during the spray period of the humidified air, and the dew condensation evaporates if the spray of the humidified air stops. As a result, an appropriate amount of OH groups are attached to the bonding surface of the target object without leaving droplets.

DESCRIPTION OF EMBODIMENTS

Figure 1:
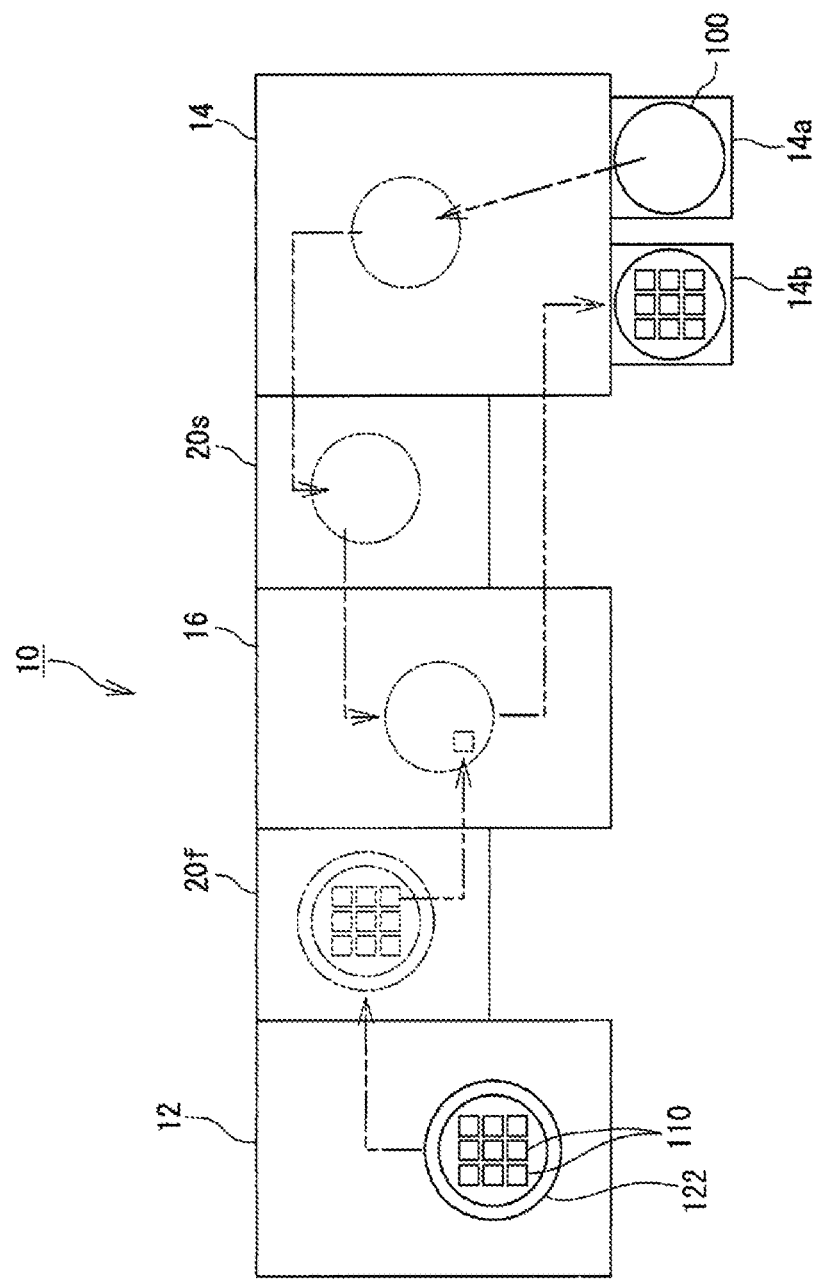
FIG. 1 is a view showing a configuration of a manufacturing apparatus for a semiconductor device.
Figure 2:
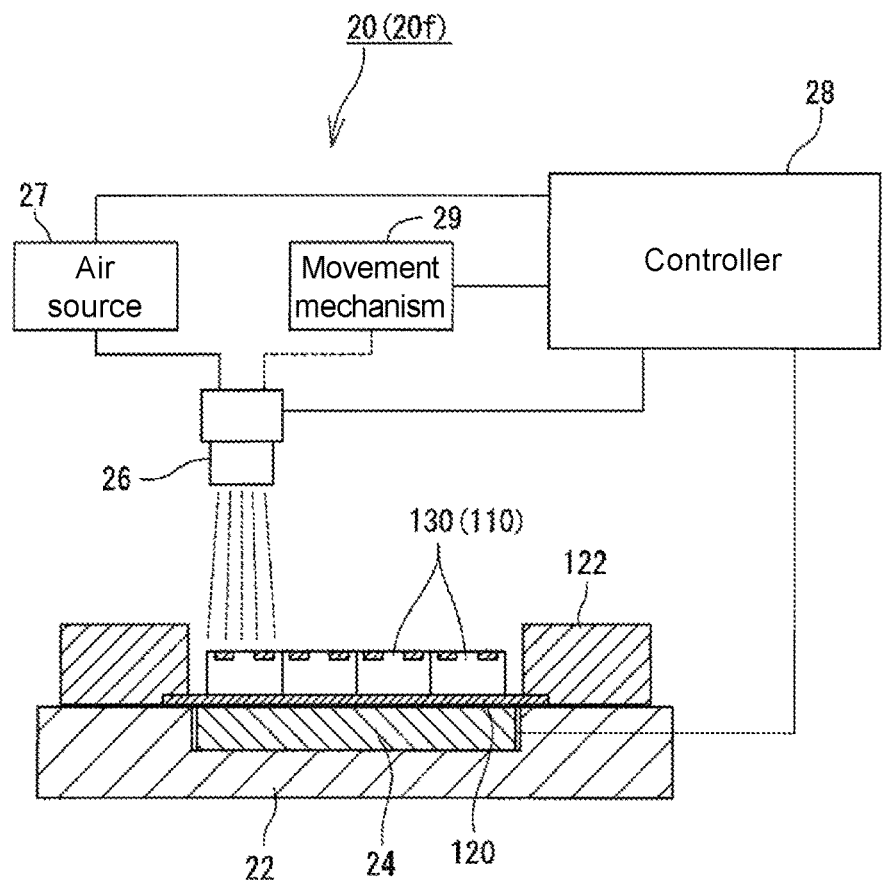
FIG. 2 is a view showing a configuration of a surface treatment apparatus incorporated into the manufacturing apparatus.

A manufacturing apparatus 10 for a semiconductor device will be described below with reference to the drawings. FIG. 1 is a view showing a configuration of the manufacturing apparatus 10 for a semiconductor device. FIG. 2 is a view showing a configuration of a surface treatment apparatus 20 incorporated into the manufacturing apparatus 10.

The manufacturing apparatus 10 manufactures a semiconductor device by bonding one or more chips 110 to a wafer 100 that functions as a substrate. Hydrogen bonding is used to bond the chip 110 to the wafer 100, which will be described later.

As shown in FIG. 1, the manufacturing apparatus 10 includes a chip supply unit 12, a substrate supply unit 14, a bonding unit 16, a first surface treatment apparatus 20f, and a second surface treatment apparatus 20s. The chip supply unit 12 supplies the chip 110 to the first surface treatment apparatus 20f. Herein, the chip 110 is supplied to the first surface treatment apparatus 20f while being adhered to a dicing tape 120 (not visible in FIG. 1) stretched on the inner side of a dicing ring 122, which is an annular frame member. The chip 110 is adhered to the dicing tape 120 with its bottom surface (i.e., bonding surface with the wafer 100) facing upward.

The substrate supply unit 14 serves to load and unload the wafer 100, and includes, for example, an arm robot (not shown) for transporting the wafer 100. An unprocessed wafer 100 is loaded from a loading port 14a and transported to the second surface treatment apparatus 20s. Further, a semiconductor device manufactured by bonding is unloaded from an unloading port 14b.

The first surface treatment apparatus 20f applies a hydrophilic treatment to the surface of the supplied chip 110. The second surface treatment apparatus 20s applies a hydrophilic treatment to the surface of the supplied wafer 100. Configurations of the first surface treatment apparatus 20f and the second surface treatment apparatus 20s are substantially the same. Hereinafter, the two will be denoted as a "surface treatment apparatus 20" when not particularly distinguished. A specific configuration of the surface treatment apparatus 20 will be described later.

The bonding unit 16 bonds one or more chips 110 to the wafer 100 to manufacture a semiconductor device. Specifically, the bonding unit 16 includes a stage on which the wafer 100 is placed, and a bonding head that holds the chip 110 by suction and is capable of performing heating (neither of which is shown). A bonding process performed by the bonding unit 16 will be described with reference to FIG. 3.

Figure 3:
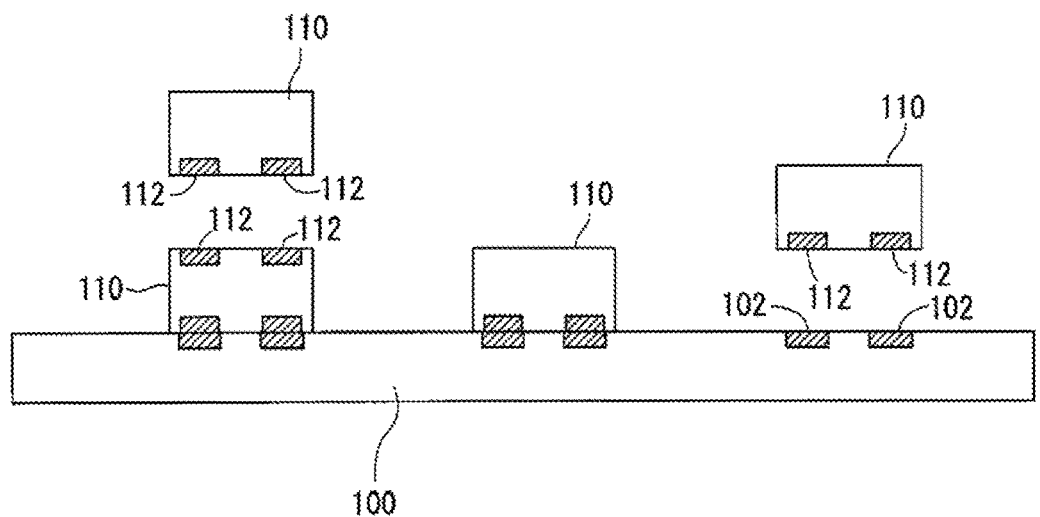
FIG. 3 is a schematic view illustrating bonding.

FIG. 3 is a schematic view illustrating bonding. When manufacturing a semiconductor device, chips 110 are bonded to the top surface of a wafer 100, as shown in FIG. 3. Further, in the case of bonding two or more chips 110 in the thickness direction, another chip 110 is bonded onto the chip 110 that has been bonded to the wafer 100. Electrodes 102 and 112 are provided on the bonding surfaces, i.e., the top surface of the wafer 100, the bottom surface of the chip 110, and the top surface of the chip 110. The bonding unit 16 bonds the electrodes 112 of the chip 110 with the electrodes 102 of the wafer 100 or the electrodes 112 of another chip 110 so that the electrodes are in contact with each other. Thus, the wafer 100 and the chip 110, or the chip 110 and the chip 110, are electrically connected with each other.

Figure 4:
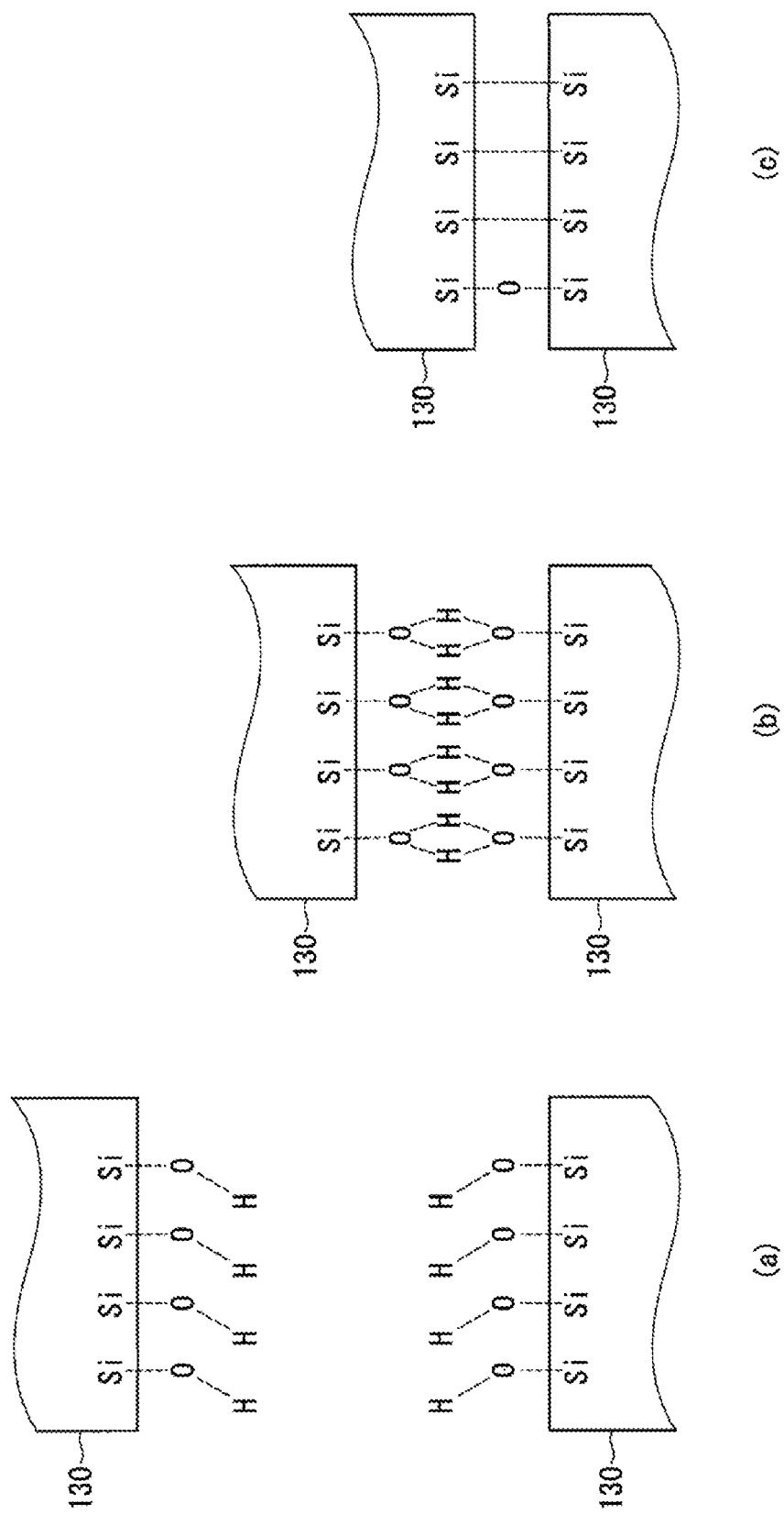
FIG. 4 is a schematic view illustrating hydrogen bonding.

Hydrogen bonding is used when bonding the chip 110 with the wafer 100 or bonding the chip 110 with the chip 110. FIG. 4 is a schematic view illustrating hydrogen bonding. In FIG. 4, reference sign "130" denotes target objects to be bonded together, i.e., the chip 110 or the wafer 100. In the case where the chip 110 is the target object 130, the wafer 100 or another chip 110 is a bonded object to be bonded with the target object 130; in the case where the wafer 100 is the target object 130, the chip 110 is a bonded object to be bonded with the target object 130. In this example, prior to bonding of the target object 130, a hydrophilic treatment is applied to the bonding surface of the target object 130 in advance by the surface treatment apparatus 20. As a specific method for the hydrophilic treatment (to be detailed later), by performing a hydrophilic treatment, as shown in (a) of FIG. 4, Si atoms of the bonding surface of the target object 130 are chemically bonded with OH groups, and OH groups are attached to the bonding surface of the target object 130. In this state, when two target objects 130 are approached and brought into contact, as shown in (b) of FIG. 4, the OH groups attached to one target object 130 and the OH groups attached to the other target object 130 become molecularly bonded with each other, that is, becoming hydrogen-bonded.

Although hydrogen bonding provides a certain level of bonding strength, the bonding strength is not sufficient for a semiconductor device. Thus, after hydrogen-bonding the target objects 130 with each other, the target objects 130 are heated to further increase the bonding strength. After hydrogen bonding, when the target objects 130 are heated, water molecules $H_2O$ evaporate, and Si atoms respectively of the two target objects 130 become bonded with each other, as shown in (c) of FIG. 4. In this state, since the two target objects 130 are atomically and directly bonded, a very strong bonding strength can be obtained.

In this manner, in the case of bonding the target objects 130 using hydrogen bonding, since other adhesives, e.g., resins such as non-conductive films, are not required, it is possible to effectively prevent problems such as a decrease in conductivity caused by the resin entering the bonding surfaces of the electrodes 102 and 112. Further, in the above case, since it is not required to provide protrusions such as solder bumps on the bottom surface of the chip 110, the thickness of the chip 110 and thus the semiconductor device can be reduced.

In the case of performing such bonding using hydrogen bonding, as described above, it is required to apply a hydrophilic treatment for attaching OH groups to the bonding surface of the target object 130. In this example, to apply the hydrophilic treatment, a first surface treatment apparatus 20f and a second surface treatment apparatus 20s are provided. Configurations of the first surface treatment apparatus 20f and the second surface treatment apparatus 20s are substantially the same, so the configuration of the surface treatment apparatus 20 will be described below by taking the first surface treatment apparatus 20f as an example.

FIG. 2 is a view showing the configuration of the surface treatment apparatus 20 (specifically, first surface treatment apparatus 20f). The surface treatment apparatus 20 causes dew condensation temporarily on the bonding surface of the target object 130 to hydrophilize the bonding surface. The surface treatment apparatus 20 includes a support base 22 that supports the target object 130, and a spray nozzle 26 that sprays humidified air onto the target object 130.

Supporting a surface opposite to the bonding surface of the target object, the support base 22 is a table on which the target object 130 is placed with the bonding surface of the target object 130 being exposed to the outside. In the case of the first surface treatment apparatus 20f, the chip 110, which is the target object 130, is placed on the support base 22 together with the dicing ring 122. In other words, in the case of the first surface treatment apparatus 20f, a plurality of target objects 130 (chips 110) are placed on the support base 22 together. A cooler 24 for cooling the target object 130 is incorporated into the support base 22.

The cooler 24 includes, for example, a cooling plate and a cooling mechanism that cools the cooling plate. The cooling plate is a plate on which the target object 130 is placed, and is made of a highly heat-conductive metal such as copper or aluminum. Further, the cooling mechanism may be, for example, a heat absorbing element such as a Peltier element, a heat pump, etc. Driving of such a cooling mechanism is controlled by a controller 28. The controller 28 controls driving of the manufacturing apparatus 10, and is, for example, a computer having a processor and a memory.

In this example, the cooler 24 covers all of the one or more target objects 130, while the frame member (i.e., dicing ring 122) surrounding the one or more target objects 130 is set to a position and a size at which the frame member is not covered. With such a configuration, it is possible to only cool the target object 130, and it is possible to prevent occurrence of dew condensation on the surface of the frame member, which will be described later.

The spray nozzle 26 is provided above the support base 22. The spray nozzle 26 is a nozzle that sprays humidified air onto the bonding surface of the target object 130. An air source 27 that generates humidified air and supplies the humidified air to the spray nozzle 26 is connected to the spray nozzle 26. The air source 27 generates humidified air having predetermined temperature and humidity using sufficiently purified clean air and pure water. Furthermore, a pump for pumping the supplied humidified air, a valve for controlling ejection of the humidified air (both not shown), etc. may be provided on a flow path connecting the spray nozzle 26 and the air source 27. Further, in this example, a spray area of the spray nozzle 26 does not cover all of the one or more target objects 130 supported by the support base 22. Thus, in this example, a movement mechanism 29 is provided to move the spray nozzle 26 with respect to the support base 22. The movement mechanism 29 may be, for example, an XY table or the like using a motor as a driving source. Moved by the movement mechanism 29, the spray nozzle 26 is capable of scanning the bonding surface of all of the one or more target objects 130. Spray of humidified air performed by the spray nozzle 26 is driven and controlled by the controller 28.

Figure 5:
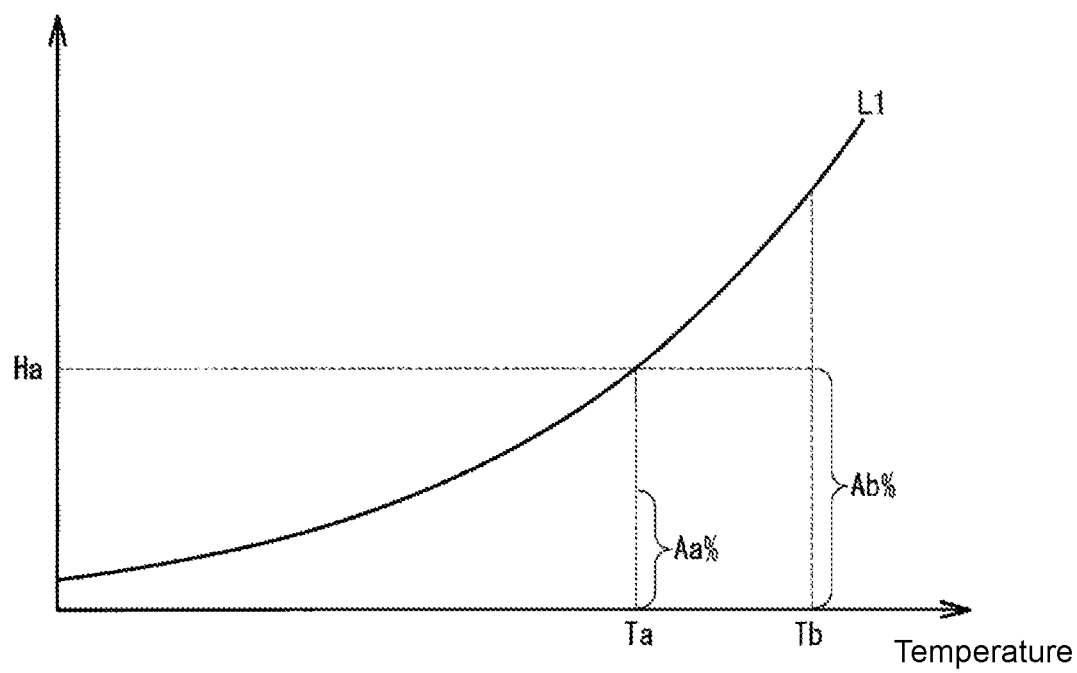
FIG. 5 is a view showing temperature and humidity conditions of humidified air.
Figure 6:
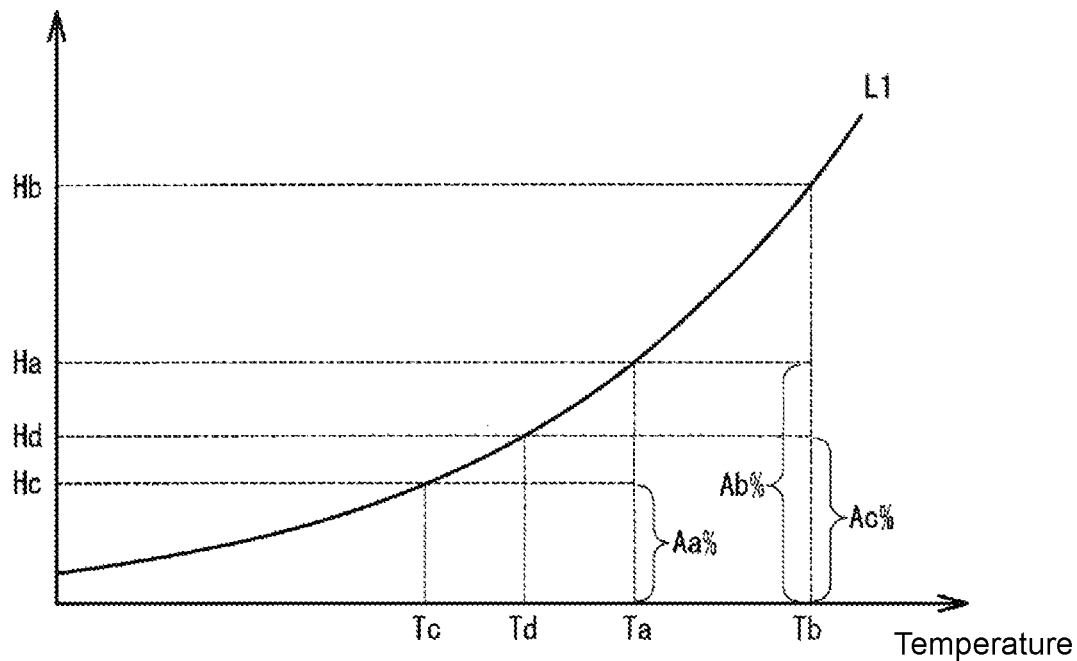
FIG. 6 is a view showing temperature and humidity conditions of humidified air.

In this example, by spraying humidified air onto the bonding surface from the spray nozzle 26, dew condensation occurs on the bonding surface temporarily, that is, only during the spray period of the humidified air, and the dew condensation evaporates during the other periods. To make this phenomenon occur, it is required to bring the bonding surface of the target object 130 to a temperature at which dew condensation does not occur in the ambient atmosphere. Further, it is required to set the humidified air to a temperature and a humidity at which dew condensation occurs at the temperature of the bonding surface of the target object 130. The setting of the temperature of the bonding surface and the temperature and humidity of the humidified air will be described with reference to FIG. 5 and FIG. 6. FIG. 5 and FIG. 6 are graphs showing a saturated water vapor pressure of water. In FIG. 5 and FIG. 6, the horizontal axis indicates temperature, and the vertical axis indicates water vapor pressure. In FIG. 5 and FIG. 6, Ta and Aa indicate the temperature and the humidity of the ambient atmosphere.

First, with reference to FIG. 5, conditions of the humidified air in the case where the target object 130 is not cooled by the cooler 24 will be examined. In the case where cooling is not performed, the temperature of the bonding surface of the target object 130 is equal to the temperature Ta of the ambient atmosphere. The saturated water vapor pressure at the temperature Ta is Ha. If air having a water vapor pressure exceeding the saturated water vapor pressure Ha comes into contact with the bonding surface, dew condensation will occur on the bonding surface. Thus, the humidified air should have a water vapor pressure equal to or higher than the saturated water vapor pressure Ha at the ambient atmospheric temperature Ta (i.e., temperature of the bonding surface). For example, in the case where the temperature of the humidified air is Tb and the saturated water vapor pressure at the temperature Tb is Hb, the humidity of the humidified air should be (Aa=Ha/Hb×100)% or higher. During the period in which such humidified air is sprayed, dew condensation occurs on the bonding surface. On the other hand, if spray of the humidified air is stopped, the dew condensation evaporates because the humidity of the ambient atmosphere is sufficiently low. Once a very thin water film is formed on the bonding surface due to dew condensation, even if droplets evaporate afterwards, OH groups remain attached to the surface of the bonding surface. In other words, according to this method, it is possible to easily attach an appropriate amount of OH groups to the bonding surface while effectively preventing droplets from remaining.

In this manner, dew condensation can be generated without cooling the target object 130, but in that case, the humidity of the humidified air is required to be considerably high, and the burden on generating humidified air is large. Thus, the target object 130 may be cooled by the cooler 24 in conjunction with the spray of humidified air. Conditions of the humidified air in the case where the target object 130 is cooled by the cooler 24 will be described with reference to FIG. 6.

In the case of cooling the target object 130, it is required to suppress the cooling temperature to a temperature at which dew condensation does not occur in the ambient atmosphere. Specifically, in the case where the ambient atmosphere has a temperature of Ta and a humidity of Aa %, the water vapor pressure contained in the ambient atmosphere is Hc. Since the dew point of the water vapor pressure He is Tc, dew condensation occurs in the ambient atmosphere at the temperature Tc or lower. Thus, in the case of cooling the target object 130, the bonding surface temperature should exceed the dew point of the water vapor pressure contained in the ambient atmosphere, that is, exceeding Tc in the example of FIG. 6.

Herein, a case where the bonding surface temperature becomes Td (where Tc<Td<Ta) due to the cooler 24 is considered. In this case, since the saturated water vapor pressure at the bonding surface temperature Td is Hd, it is required for the humidified air to have a water vapor pressure equal to or higher than Hd to generate dew condensation on the bonding surface. Thus, in the case where the temperature of the humidified air is Tb, the humidity of the humidified air should be (Ac=Hd/Hb×100)% or higher. The humidity Ac % is lower than the humidity Ab % required for the case where the target object 130 is not cooled. By cooling the target object 130 in this manner, the humidity required for the humidified air can be kept relatively low.

In this example, only the target object 130 is cooled, and the frame member surrounding the target object 130 is not cooled. Thus, the surface temperature of the frame member is equal to the temperature Ta of the ambient atmosphere. In other words, there is a temperature difference between the target object 130 and the frame member. With this temperature difference, dew condensation may occur only on the bonding surface of the cooled object 130 and not on the surface of the uncooled frame member. Specifically, the humidified air may contain a water vapor pressure equal to or higher than the saturated water vapor pressure He of the bonding surface temperature Td and lower than the saturated water vapor pressure Ha of the ambient temperature Ta. Specifically, if the humidity of the humidified air is set to be equal to or higher than Ac % and less than Ab %, dew condensation occurs on the bonding surface, and dew condensation on the frame member can be prevented.

In any case, by spraying humidified air having a water vapor pressure equal to or higher than the saturated water vapor pressure corresponding to the bonding surface temperature of the target object 130, dew condensation can be generated only during the spray period, and the dew condensation can evaporate after the spray is stopped. Thus, an appropriate amount of OH groups can be easily attached to the bonding surface.

Herein, the advantage of spraying such humidified air will be described in comparison with other techniques. Conventionally, to hydrophilize the bonding surface, it has been proposed to discharge liquid pure water onto the bonding surface. This technique can also attach OH groups to the bonding surface, but in this case, the droplets remain non-uniformly on the bonding surface. The droplets remaining in this manner remain at the bonding interface even after the target object 130 is hydrogen-bonded. If the target object 130 is heated with a large amount of water molecules remaining at the bonding interface, the remaining water molecules are rapidly removed from the bonding interface, thus creating voids (microvoids). Such voids naturally cause deterioration in the bonding quality.

As another form, it is conceivable to hydrophilize the bonding surface by cooling the target object 130 until dew condensation occurs. That is, in the example of FIG. 6, if the bonding surface of the target object 130 is cooled to be equal to or lower than the dew point temperature Tc of the water vapor pressure Hc of the ambient atmosphere, dew condensation occurs on the bonding surface even without spraying humidified air. However, it takes a certain amount of time to raise the temperature of the once cooled target object 130 to a temperature at which dew condensation evaporates. Thus, in the case where the target object 130 is cooled to cause dew condensation, until the temperature of the target object 130 rises to an evaporation temperature, the dew condensation continues, and a large amount of droplets are generated on the bonding surface. In this case, even if the temperature of the bonding surface rises sufficiently, it is difficult to quickly evaporate a large amount of droplets once generated. As a result, also in this case, a large amount of water molecules remain at the bonding interface after hydrogen bonding, and it is likely that voids are created after heating treatment.

Furthermore, as another form, it is conceivable to attach OH groups to the bonding surface by placing the target object 130 in a high-humidity environment instead of causing dew condensation. According to this form, since droplets are not generated, a large amount of water molecules can be prevented from remaining at the bonding interface after hydrogen bonding. However, in this case, gaseous water molecules are merely brought into contact with the bonding surface, and it is difficult to cause bonding between OH groups and the bonding surface. Thus, to attach OH groups to the bonding surface sufficiently and reliably, the bonding surface needs to be activated in advance by plasma treatment or the like, which complicates the overall process.

On the other hand, in this example, as described above, humidified air containing a water vapor pressure equal to or higher than the saturated water vapor pressure of the bonding surface temperature is sprayed onto the bonding surface. Thus, a uniform water film can be instantly formed on the bonding surface, and OH groups can be attached to the bonding surface. Further, if spray of the humidified air is stopped, the water film evaporates immediately, so the remaining droplets and thus creation of voids can be effectively suppressed.

Figure 7:
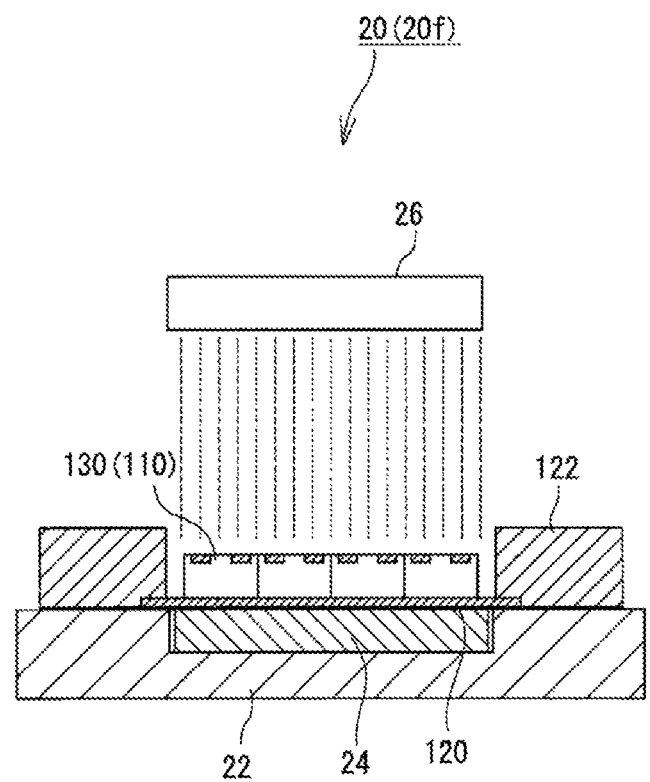
FIG. 7 is a view showing another example of a spray nozzle.
Figure 8:
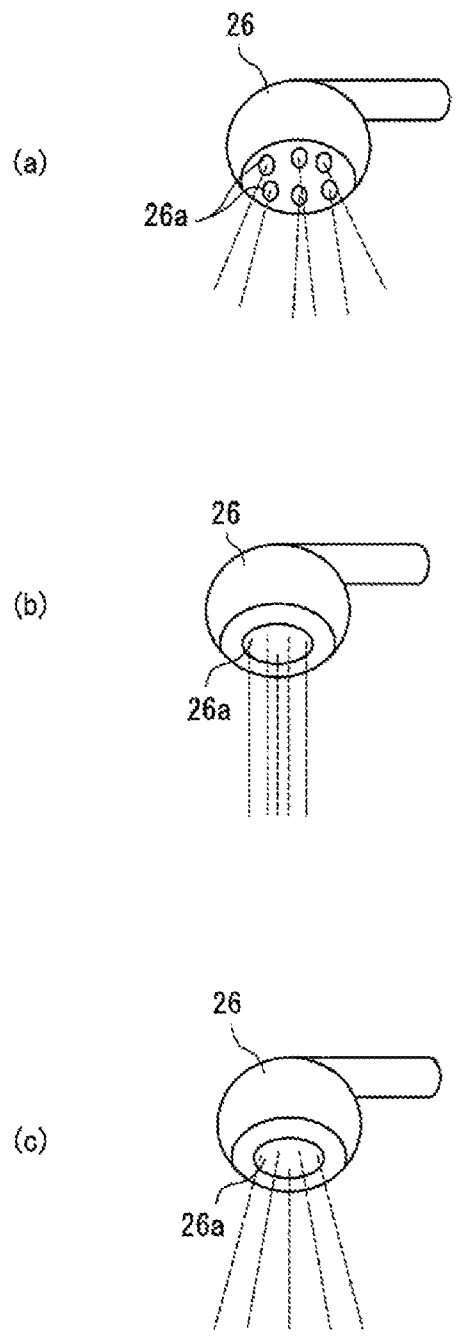
FIG. 8 is a view showing other examples of the spray nozzle.

In the example of FIG. 2, since the spray area of the spray nozzle 26 is smaller than the total area of the plurality of target objects 130 placed on the support base 22, the spray nozzle 26 is moved to scan the area. However, the configuration of such a spray nozzle 26 may be changed as appropriate. For example, as shown in FIG. 7, the spray nozzle 26 may have a spray area capable of covering all of the plurality of target objects 130. Further, as shown in (a) of FIG. 8, a plurality of spray holes 26a may be provided at the spray nozzle 26. With such a configuration, humidified air can be evenly dispersed more reliably. As another form, the spray hole 26a provided at the spray nozzle 26 may be one spray hole as shown in (b) of FIG. 8. With such a configuration, the configuration of the spray nozzle 26 can be simplified. Humidified air may be sprayed in a columnar pattern as shown in (b) of FIG. 8, or may be sprayed in a conical pattern expanding in diameter as it goes downstream, as shown in (c) of FIG. 8.

Figure 9:
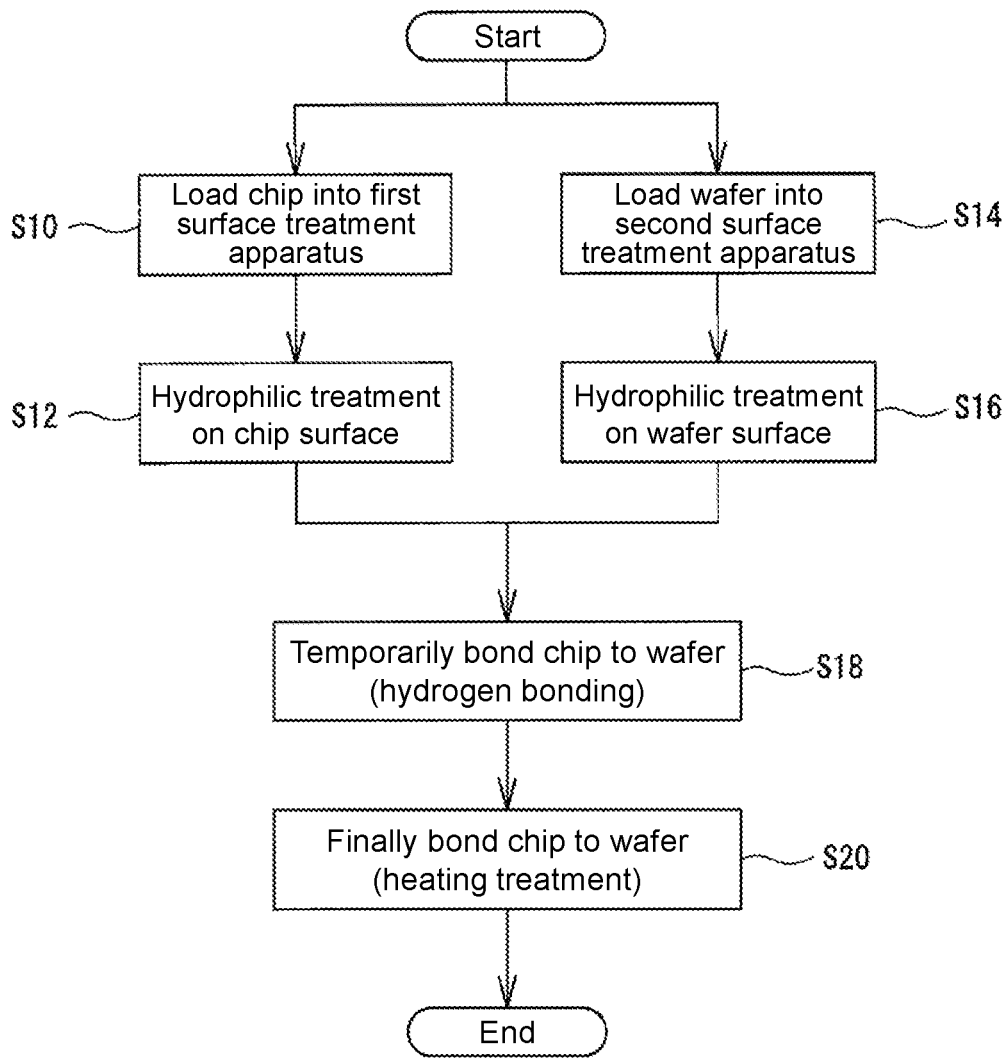
FIG. 9 is a flowchart showing a flow of manufacturing a semiconductor device by the manufacturing apparatus.

Next, a flow of manufacturing a semiconductor device by the manufacturing apparatus 10 of this example will be described with reference to FIG. 9. When manufacturing a semiconductor device, first, a chip 110 is transported from the chip supply unit 12 to the first surface treatment apparatus 20f (S10). In this case, the chip 110 is loaded into the first surface treatment apparatus 20f while being adhered to the dicing tape 120 stretched on the inner side of the dicing ring 122. In the first surface treatment apparatus 20f, a hydrophilic treatment is applied to the bonding surface of one or more chips 110 (S12). Specifically, with the chip 110 being placed on the support base 22, the chip 110 is cooled, and humidified air is sprayed onto the bonding surface of the chip 110 by the spray nozzle 26. Thus, a small amount of dew condensation instantaneously occurs on the bonding surface. However, this dew condensation evaporates as soon as spray of the humidified air is stopped. As the dew condensation evaporates, although droplets do not exist on the bonding surface, OH groups become bonded to the Si atoms of the bonding surface.

In parallel with the hydrophilic treatment of the chip 110, a hydrophilic treatment of the wafer 100 is also performed. That is, a wafer 100 functioning as a substrate is transported from the substrate supply unit 14 to the second surface treatment apparatus 20s (S14). Subsequently, a hydrophilic treatment is applied to the transported wafer 100 (S16). Specifically, with the wafer 100 being placed on the support base 22, the wafer 100 is cooled, and humidified air is sprayed onto the bonding surface of the wafer 100 by the spray nozzle 26.

After the hydrophilic treatments of the chip 110 and the wafer 100 are completed, the chip 110 is temporarily bonded to the wafer 100 by hydrogen bonding (S18). Specifically, the hydrophilized wafer 100 is transported to the bonding unit 16 and placed on a table provided in the bonding unit 16. A bonding tool provided in the bonding unit 16 holds the hydrophilized chip 110 by suction and places it on the top surface of the wafer 100. With the bonding surfaces of the chip 110 and the wafer 100 coming into contact with each other, the OH groups attached to the two bonding surfaces are hydrogen-bonded. Thus, the chip 110 and the wafer 100 are temporarily bonded with a certain level of bonding strength.

After the temporary bonding is completed, the temporarily bonded wafer 100 and chip 110 are then heated for final bonding (S20). By heating the chip 110 and the wafer 100, water molecules at the bonding interface evaporate, and Si atoms of the two are strongly bonded together. In other words, the silicon of the chip 110 and the silicon of the wafer 100 are atomically bonded together. Thus, a strong bonding strength is obtained.

If all the necessary chips 110 are bonded to the wafer 100, the manufacturing of the semiconductor device is completed. Herein, the case where the chips 110 are not stacked has been described as an example, but two or more chips 110 may also be stacked in the thickness direction. In that case, the top surface of the chip 110 located on the lower side serves as a bonding surface with another chip 110 stacked thereon, and the top surface of the lower chip 110 may or may not be hydrophilized. In the case where the top surface of the lower chip 110 is hydrophilized, for example, after placing the lower chip 110 on the wafer 100, the lower chip 110 may be loaded again into the surface treatment apparatus 20 together with the wafer 100.

Further, the configuration described so far is an example, and other configurations may be changed as appropriate as long as the surface treatment apparatus 20 at least includes the support base 22 which supports a surface of the target object 130 opposite to the bonding surface, and the spray nozzle which sprays, onto the bonding surface, humidified air having a water vapor pressure equal to or higher than the saturated water vapor pressure corresponding to the temperature of the bonding surface.

For example, in this example, hydrophilic treatment is applied to both the chip 110 and the wafer 100, but the hydrophilic treatment may also be applied to only at least one of the chip 110 and the wafer 100. Thus, the manufacturing apparatus 10 may be configured to include only one of the first surface treatment apparatus 20f and the second surface treatment apparatus 20s and not include the other. Further, in this example, the target object 130 is cooled in the hydrophilic treatment, but it is also possible not to cool the target object 130.

Further, in this example, only the hydrophilic treatment is performed on the bonding surface. However, prior to the hydrophilic treatment, another surface treatment, such as a plasma treatment of irradiating the bonding surface with plasma to activate atoms on the bonding surface, may also be performed. Further, in this example, the surface treatment apparatus 20 is incorporated into the manufacturing apparatus 10 for a semiconductor device, but the surface treatment apparatus 20 may also be incorporated into another apparatus that bonds the target object 130 using hydrogen bonding. Further, the surface treatment apparatus 20 may also be used alone without being incorporated into another apparatus.

What is claimed is:

1. A surface treatment apparatus which applies a hydrophilic treatment to a bonding surface of a target object bonded to a bonded object using hydrogen bonding, the hydrophilic treatment being applied prior to the bonding, the surface treatment apparatus comprising:
    a support base which supports a surface of the target object opposite to the bonding surface, the target object being one or more target objects;
    a spray nozzle which causes dew condensation temporarily on the bonding surface by spraying, onto the bonding surface of the target object supported by the support base, humidified air having a water vapor pressure equal to or higher than a saturated water vapor pressure corresponding to a temperature of the bonding surface; and
    a movement mechanism comprising a motor, wherein
    the movement mechanism is configured to move the spray nozzle with respect to the support base so that the spraying nozzle is capable of scanning the bonding surface while spraying the humidified air, wherein
    the support base further comprises a cooler which cools the temperature of the bonding surface to a temperature lower than a temperature of an ambient atmosphere and higher than a dew point temperature of a water vapor pressure of the ambient atmosphere,
    the one or more target objects are placed on the support base with their periphery lateral surface being surrounded by a frame member having a ring-shape, and
    the cooler cools the one or more target objects, and the frame member has a position and a size at which the frame member is not cooled.

2. The surface treatment apparatus according to claim 1, wherein
    the spray nozzle has a spray area covering all of the one or more target objects.

3. The surface treatment apparatus according to claim 1, wherein
    the target object is a chip which is a semiconductor integrated circuit or a wafer to which the chip is bonded.

4. A manufacturing apparatus for a semiconductor device, which manufactures a semiconductor device by bonding a chip, which is a semiconductor integrated circuit, to a wafer using hydrogen bonding, the manufacturing apparatus for a semiconductor device comprising:
- a bonding unit which bonds the chip to a top surface of the wafer or another chip mounted on the wafer; and
- one or more surface treatment apparatuses which apply a hydrophilic treatment to a bonding surface of a target object, which is the chip or the wafer, prior to the bonding, wherein
- each of the one or more surface treatment apparatuses comprises:
- a support base which supports a surface of the target object opposite to the bonding surface, the target object being one or more target objects;
- a spray nozzle which causes dew condensation temporarily on the bonding surface by spraying, onto the bonding surface of the target object supported by the support base, humidified air having a water vapor pressure equal to or higher than a saturated water vapor pressure corresponding to a temperature of the bonding surface; and
- a movement mechanism comprising a motor, wherein
- the movement mechanism is configured to move the spray nozzle with respect to the support base so that the spraying nozzle is capable of scanning the bonding surface while spraying the humidified air, wherein
- the support base further comprises a cooler which cools the temperature of the bonding surface to a temperature lower than a temperature of an ambient atmosphere and higher than a dew point temperature of a water vapor pressure of the ambient atmosphere,
- the one or more target objects are placed on the support base with their periphery lateral surface being surrounded by a frame member having a ring-shape, and
- the cooler cools the one or more target objects, and the frame member has a position and a size at which the frame member is not cooled.

* * * * *